United States Patent
El Gomati et al.

(10) Patent No.: US 6,570,163 B1
(45) Date of Patent: May 27, 2003

(54) ELECTRON DETECTORS

(75) Inventors: Mohamed Mochtar El Gomati, Osbaldwick (GB); Ludek Frank, Brno (CZ); Ilona Mullerova, Brno (CZ)

(73) Assignees: University of York, Heslington (GB); Shimadzu Research Laboratory (Europe) Ltd., Manchester (GB)

( * ) Notice: Subject to any disclaimer, the term of this patent is extended or adjusted under 35 U.S.C. 154(b) by 0 days.

(21) Appl. No.: 09/508,345

(22) PCT Filed: Sep. 14, 1998

(86) PCT No.: PCT/GB98/02720

§ 371 (c)(1),
(2), (4) Date: Apr. 17, 2000

(87) PCT Pub. No.: WO99/14785

PCT Pub. Date: Mar. 25, 1999

(30) Foreign Application Priority Data

Sep. 13, 1997 (GB) .............................................. 9719417

(51) Int. Cl.[7] .............................................. H01J 37/28
(52) U.S. Cl. ....................................... 250/397; 250/310
(58) Field of Search ................................. 250/397, 310

(56) References Cited

U.S. PATENT DOCUMENTS

| | | |
|---|---|---|
| 3,914,606 A | 10/1975 | Hashimoto |
| 4,587,425 A | 5/1986 | Plows |
| 4,658,137 A | 4/1987 | Garth et al. |
| 4,812,651 A | 3/1989 | Feuerbaum et al. |
| 4,831,267 A * | 5/1989 | Brunner ........................ 250/397 |
| 4,988,868 A * | 1/1991 | Gray ............................ 250/397 |
| 5,387,793 A | 2/1995 | Sato et al. |
| 5,408,098 A | 4/1995 | Wells |
| 5,466,940 A * | 11/1995 | Litman et al. ............... 250/397 |
| 5,872,358 A * | 2/1999 | Todokoro .................... 250/310 |
| 6,069,356 A * | 5/2000 | Todokoro et al. ........... 250/310 |
| 6,172,363 B1 * | 1/2001 | Shinada et al. ............. 250/310 |
| 6,236,053 B1 * | 5/2001 | Shariv ........................ 250/397 |

* cited by examiner

Primary Examiner—Kiet T. Nguyen
(74) Attorney, Agent, or Firm—Smith-Hill and Bedell

(57) ABSTRACT

A cathode lens is formed between a gun electrode (8) and a specimen (9). An electron probe (11), produced as part of an electron column and suitably focused by lenses (1, 2 and 3) and scanned by suitable deflector/stigmator electrodes (2), is decelerated within the cathode lens field and its final landing energy is finely adjustable by the specimen negative bias. Emitted secondary electrons are re-accelerated within the same field and due to uniformity of this field, they increase their axial velocity only so that they are collimated into a narrow signal beam. The collimated signal beam passes mostly through an aperture (18) of electrode (8), where it enters the gun and a final lens consisting of a central earthed electrode (6) surrounded by two earthed electrodes (7) and (8). The signal beam approaches a special mirror electrode (4), the field of which decelerates and deflects the electrons further off the axis and returns them back towards the specimen (9). They are again re-accelerated in the final lens field, and impact a channel-plate electron multiplier (5) and after amplification, the signal electron beam impacts a collector (7), which can be divided into suitable parts for multichannel detection. The detector may have small dimensions and high resolution, and may be used in microscopes and other devices.

12 Claims, 1 Drawing Sheet

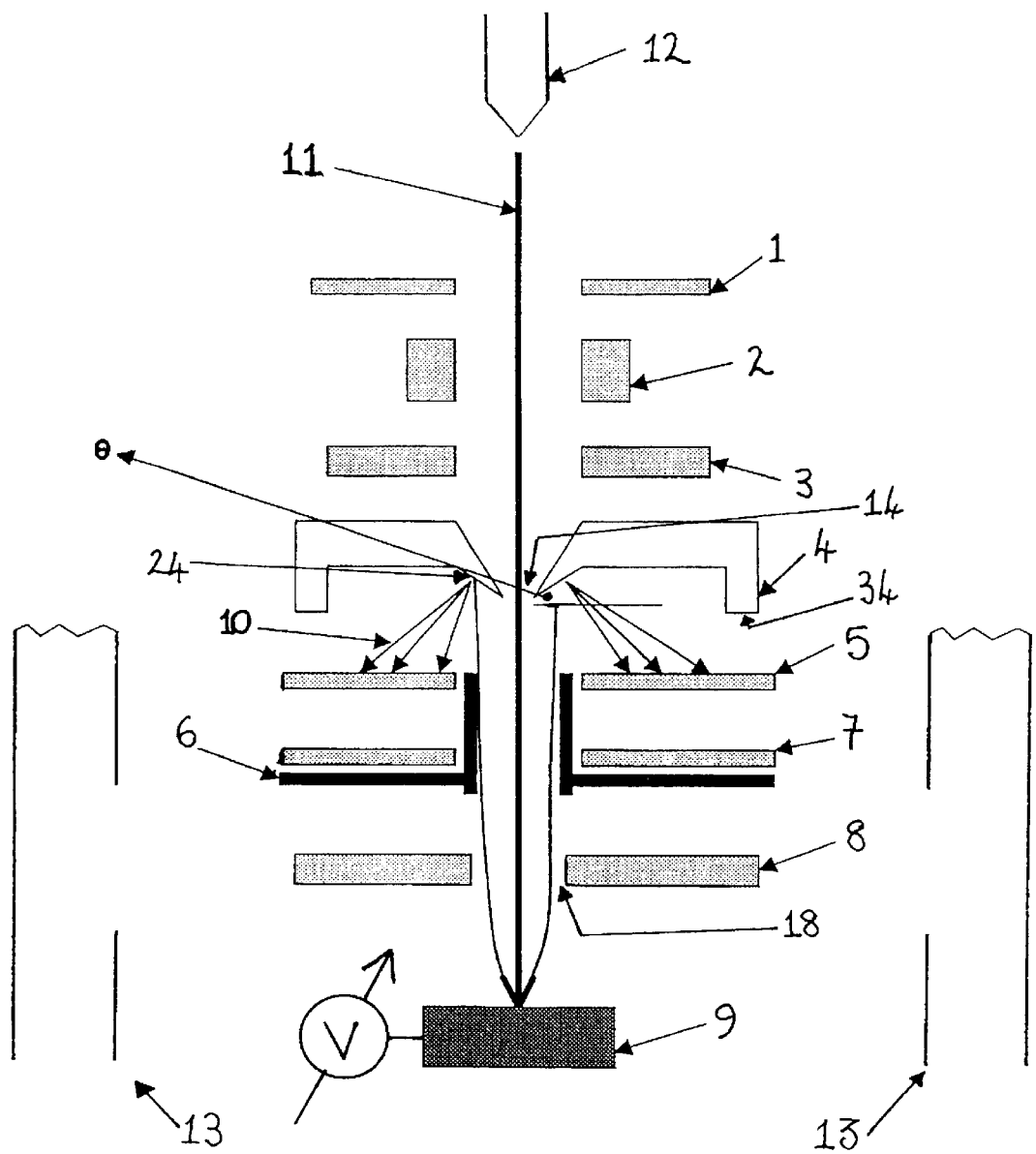

ELECTRON DETECTORS

The present invention relates to electron detectors, and is concerned particularly, although not exclusively, with electron detectors for use in electron microscopes.

It is known to provide a focused electron beam, referred to as an electron probe, to impact onto a specimen under observation. The probe is scanned over a viewfield of adjustable dimensions and signal electrons, emitted from the specimen and detected, are fed to a CRT monitor scanned synchronously with the electron probe so that an image is formed on the monitor screen, with the magnification given by ratio of sizes of both of the scanned fields.

From all possible signals excited by an electron probe, so-called Auger electrons are of particular importance. They are released from atoms which are originally ionised in an inner shell by an electron from the electron probe; the vacancy is then filled by another electron from some other outer shell of the same or even different atom, and the energy difference is transmitted to one more electron which leaves the atom with an energy characteristic to it. Consequently, when analysing the energies of the signal electrons, one can recognise the surface elemental composition. By means of a finely focused electron probe, this can be done even at high spatial resolution. The energy analysis is made by an electron spectrometer, i.e. some special configuration of electrostatic or magnetic fields or combination of fields that ensures spatial dispersion of the electron trajectories according to their energy so that, by screening with suitable apertures, only a narrow energy window can be filtered, or alternatively, parallel detection of all emitted electrons is also possible.

Among possible spectrometer configurations utilising serial detection, the so-called Cylindrical Mirror Analyser (CMA) is popular and often used. It consists of two coaxial cylinders, the outer of which is negatively biased so that electrons outgoing from a specified entry point on the cylinder axis through a suitable slit in the inner cylinder wall are back reflected through a second slit and a final small aperture, again on the cylinder axis at an exit point, such that only those electrons which fall inside an energy window are passed.

In order to perform Scanning Auger Microscopy (SAM), i.e. to achieve elemental surface analysis with a high spatial resolution, an electron gun is co-axially positioned inside the inner cylinder of the CMA and is used for illuminating the specimen, placed on the device axis perpendicularly or inclined to it at the entry point, and has to be a high-quality electron gun with a very finely focused electron probe and with facilities to scan the probe within the scanned field. Such a sophisticated gun, the scanning column, is currently available equipped with a field-emission single-crystal tip cathode and one or two electron lenses. It is of importance that the scanning column has to fit inside a very limited place surrounded by the spectrometer cylinder so that no mechanical actuators, lightpipes or similar connections can be led to it. All connections to the outside have to be exclusively electric and the scanning column is not allowed to produce any electromagnetic fields in its vicinity, which would interfere with the spectrometer action.

The Auger electron is recognised according to a fixed value of its energy so that it can be detected only when it does not suffer from any further scattering event causing an energy change. It means that only Auger electrons released within a few topmost atomic layers at the surface of a specimen can contribute to the signal and the elemental composition of only such an ultrathin surface layer can be reliably mapped. Nevertheless, a typical electron probe will generally penetrate much deeper into the specimen and a good number of excited electrons are reflected backwards from the surface with various energies, mostly sufficient to excite additional Auger electrons. In frequent cases, the specimen is heterogeneous in its depth so that the back-reflected electrons vary locally, together with the quantity of the additional Auger electrons, and the in-depth specimen heterogeneity projects itself spuriously into the surface elemental mapping. In order to suppress this signal contribution, some other depth sensitive signal has to be available. A second most important problem inherent to Auger mappings is the contribution of the surface topography to the elemental mapping. Again, the mapping should be correlated with another microscopic signal showing the surface relief.

There is currently a general trend in electron microscopy to lower the energies of electrons in the electron probe. The reasons for this include achievement of higher secondary electron signal (which has its maximum somewhere between a few hundred eV and a few keV); achievement of reduced charging of non-conductive specimens (owing to the total yield of the emitted electrons approaching unity, so that only a small proportion of them is dissipated inside the specimen); and better resolution of tiny relief protrusions and ridges (owing to smaller interaction volume and shorter penetration depth of the electron probe). Nevertheless, it is not possible to operate known probes below a few hundreds of eV because of some principal obstacles, which include deteriorated extraction of electrons from the gun cathode and consequently lower electron probe current, longer electron wavelength and higher relative fluctuations in energy of the electron probe (which causes larger spotsize due to increasing diffraction and chromatic aberrations) and more pronounced influence of spurious ac electromagnetic fields distorting the electron probe geometry. So called low-voltage microscopes working down to some 200 to 500 eV energy of the electron probe are currently highly attractive and well marketed. Nevertheless, it is well known that below such an energy range, at tens and units of eV, many new extremely interesting contrasts appear which visualise the surface crystallographic structure, energy band structure above the vacuum level, the potential barrier shape and its changes etc.

The only previously known way to realise very low energy microscopy, in the range of tens and units of eV, is to use a cathode lens. The cathode lens is the crucial component of an emission electron microscope (EEM) in which the specimen itself emits the electrons and after necessary acceleration they pass a projection electron-optical system forming the magnified image of the emitting surface. In principle, the cathode lens is an electrostatic lens consisting of two electrodes: the cathode, the specimen surface itself, and a suitably shaped anode with a central opening. The axial uniform electrostatic field between them, mostly produced by a high negative bias of the specimen/cathode, acts to accelerate the emitted electrons. The non-uniform part of the field, penetrating through the anode opening, forms a diverging lens, which is combined with some additional converging lens, the EEM objective lens. It is has been accepted for a long time that such a combination has very low aberration coefficients so that even at very low energies, a broad beam of the emitted electrons can be collimated into the imaging bundle.

Some attempts have been made during the last thirty years or so to utilise the cathode lens also in the reverse direction for deceleration of the electron probe immediately above the specimen surface. Nevertheless, none of these attempts has achieved significant success and no scanned very low energy pictures have been published. An important exception is the so called Low Energy Electron Microscope (LEEM) invented 35 years ago and successfully realised in the eighties [*E. Bauer, Rep. Progr. Phys.* 57(1994),895]. It is not a scanning device but an EEM with the specimen emission excited by the impact of a coherent planar electron wave. The cathode lens is passed twice, first by the electron wave being decelerated and then by the emitted electrons in the opposite direction. The LEEM practice revealed the above mentioned attractive features of the very low energy range for surface studies. LEEM instruments, available in few laboratories in the world only, are large in size and comprise both electrostatic and magnetic lenses essential for the detection of the LEEM signal. This is in favour of a scanning version of the LEEM (SLEEM) which is capable of producing similar results by much simpler apparatus.

In the area of SLEEM design and operation, important progress was recently made on the basis of improved theory of the cathode lens [*M. Lenc, I. Müllerová, Ultramicroscopy* 45(1992), 159] and a first series of scanned micrographs were published exhibiting a consistent quality along the whole energy scale from a few tens of keV down to units of eV. Afterwards, even a method of adaptation of standard commercial Scanning Electron Microscopes (SEM) to the SLEEM method was elaborated [*I. Müllerová, L. Frank, Scanning* 15 (1993), 193]. In simplified description, one can characterise this adaptation by insulation and biasing of the specimen and introducing an anode above it: the main problem is then to tailor a detection system to the configuration. Nevertheless, the basic device is still a full SEM system with usual electromagnetic lenses and coils.

The SLEEM signal, which brings specimen information with in-depth sensitivity similar to the surface sensitivity of SAM, represents the ideal alternative for a complementary imaging device, necessary to solve the crucial SAM problems described above. On the other hand, SLEEM images of real heterogeneous, polycrystalline and similar specimens are often filled with contrasts, straightforward interpretation of which is difficult or even impossible without having further information available, particularly those regarding the surface elemental composition as mediated by SAM. Thus, SAM and SLEEM are extremely suitable to be combined in-situ in an ultrahigh-vacuum device, which would need to have the SLEEM column fulfilling the requirements put onto the scanning column of the CMA based Auger microprobe, i.e. a miniature purely electrostatic SLEEM column with integrated detection system in a compact design.

No detection principle complying with these conditions has previously been proposed, and preferred embodiments of the present invention aim to provide devices which realise such a principle.

According to one aspect of the present invention, there is provided an electron detector comprising:

an accelerator plate for accelerating electrons emitted from a specimen, the plate having an aperture through which said electrons pass;

a deflecting electrode arranged to deflect said electrons after passing through said aperture; and a collector arranged to collect electrons deflected by said deflecting electrode:

wherein said deflecting electrode is arranged to deflect said electrons by a process of secondary electron emission in response to said electrons impacting a deflecting surface of the deflecting electrode.

Preferably, said deflecting electrode is provided with an electron multiplier material on said deflecting surface to deflect said electrons emitted from said specimen, such that said multiplier material multiplies such deflected electrons in use.

Preferably, said detector has a principal axis and said deflecting electrode is arranged to deflect said electrons radially outwardly of said principal axis.

Preferably, said deflecting electrode comprises a deflector plate formed with an aperture which is of smaller diameter than that in said accelerator plate.

An electron detector as above may further comprise irradiating means for irradiating a specimen in order to cause emission of said electrons from said specimen.

Preferably, said irradiating means is arranged to produce an irradiating beam that passes through said apertures in said accelerator and deflector plates.

An electron detector as above may include means for focussing said irradiating beam.

Preferably, said irradiating means comprises an electron gun.

Preferably, said accelerator plate and said specimen form a cathode lens.

An electron detector as above preferably has rotational symmetry about an axis of symmetry.

An electron detector as above preferably comprises means for applying an adjustable bias to the specimen.

The invention extends to an electron microscope provided with an electron detector according to any of the preceding aspects of the invention.

Preferably, said detector is mounted symmetrically on a principal axis of such a microscope.

For a better understanding of the invention, and to show how embodiments of the same may be carried into effect, reference will now be made, by way of example, to the accompanying diagrammatic drawing, the single FIGURE of which shows an example of an electron detector in accordance with one embodiment of the invention, in a scanning low-energy electron microscope.

The illustrated electron detector is based on a multi-lens field-emission electron column, the final lens of which is tailored to incorporate the detector. A cathode lens is formed between a gun electrode 8 and a specimen 9. An electron probe 11, produced by the probe forming part of the electron column and suitably focused by lenses 1, 2 and 3 and scanned by suitable deflector/stigmator electrodes 2, is decelerated within the cathode lens field and its final landing energy is finely adjustable by the specimen negative bias. Emitted secondary electrons are re-accelerated within the same field and due to uniformity of this field, they increase their axial velocity only so that they are collimated into a narrow signal beam. The collimated signal beam can fit in its majority into an aperture 18 of electrode 8, where it enters the gun and a final lens consisting of a central earthed (or grounded) electrode 6 surrounded by two earthed (or grounded) electrodes 7 and 8. The signal beam approaches a special mirror electrode 4, the field of which decelerates and deflects the electrons further off the axis and returns them back towards the specimen. They are again re-accelerated in the final lens field, and impact a channel-plate electron multiplier 5 and after amplification, the signal electron beam impacts a collector 7, which can be divided into suitable parts for multichannel detection.

The FIGURE shows the final lens/detector part which is an important aspect of this embodiment. This is attached to the probe 11 forming part of the column, which is in one version formed by a field-emission tip cathode based gun 12 and one electrostatic lens, to produce a pre-focused electron probe. The lens/detector part consists of the earthed (or grounded) electrode 1 as the first element of the final lens and the set of stigmator/deflector plates 2. The latter are arranged around the optical axis (they are eight in one version) and biased by composite ac and dc voltages which are adjusted so that they deflect statically the electron probe to align it. They form a cylindrical lens rotatable around the axis (in order to correct for the axial astigmatism of the column) and finally they scan the electron probe across the scanned field.

Further along the optical axis, there is the central, negatively biased focusing electrode 3 of the final lens, the bias of which governs the focal length and enables one to focus the electron probe just onto the surface of the specimen 9. It is followed by the most important part of the detector, the mirror electrode 4. The shape of this is important and consists of a small central bore 14, several tens of mm in diameter in one version, a cone 24 inclined to the horizontal (as seen) by an angle $\theta$ and a peripheral elevated rim 34. The angle $\theta$ is important for the function of the mirror electrode 4 but its value varies in a very broad interval, virtually over the whole range from 0 to $\pi/2$, according to voltages used and according to the column working distance. The mirror electrode 4 is also negatively biased to an adjustable potential.

The field above the mirror surface acts in such a way that it decelerates the incoming electrons and its radial component deflects the majority of them off the axis, except those moving exactly along the optical axis. Thus, the electrons reach sufficient distances from the axis before they impact the mirror surface. A proportion of these signal electrons "slip" the central cone and impact onto the peripheral rim or to somewhere in between. Thus, the mirror electrode is intensively bombarded by electrons, the energy of which depends on the voltages used. Under this bombardment, the mirror surface emits secondary (or, in this example, tertiary) signal electrons 10 with energies mostly a few eV only. In one version, the secondary (tertiary) electron yield is enhanced by means of the mirror electrode surface being coated by suitable material with high secondary (tertiary) electron yield. The slow secondary (tertiary) electrons 10 are then again accelerated towards the upper surface of the channel-plate electron multiplier 5 (e.g. a plate consisting of sintered very thin glass tubes, slightly inclined with respect to the plate normal, coated on their inner walls by a material with very high secondary electron yield).

For its function, the channel-plate electron multiplier (CP) needs a potential difference to be applied between its surfaces so that the entry surface is negatively biased with respect to the exit surface. Nevertheless, the potential of the upper entry surface is less negative than that of the mirror 4, so that the slow electrons 10 emitted from the mirror electrode 4 are accelerated and due to radial field component above the conical part of the mirror 4, they are further deflected off the axis but simultaneously, the influence of the peripheral rim of the mirror 4 causes the electrons not to exceed the optimum distance off the axis so that they in large majority impact the CP 5.

The electrode 6 bearing the collector 7 follows the CP 5. The electrode 6 is the second earthed electrode of the final lens and it is shaped in such a way that it screens, in one version by a thin-wall coaxial tube, the optical axis from the field due to the CP potential difference, so that its influence on the electron probe is minimised. The collector 7 is made from an insulating material on which a structure of segments is arranged in order to sort the detected signal according to azimuthal angles or radial distances of the detected electrons. Both the collector 7 and the electrode 6 are held at earth potential but the exit bottom surface of the CP 5 is at some low negative potential.

The whole assembly is closed with the electrode 8 serving as a column cup with a central bore. The electrode 8 is again earthed and it serves as the anode of the cathode lens, the cathode of which is formed by the specimen 9 itself, connected to a stable finely adjustable high-voltage supply of negative potential, at least slightly exceeding the nominal gun voltage (in order to provide for the mirror imaging, necessary for the adjustment).

In one version, the whole assembly is embedded into a gun cap, which has a conical shape which fits the inner shape of a hollow conical electron beam accepted by a CMA 13. The individual elements are mutually insulated, appropriately, with respect to their biases. The insulating inserts are in one version made from a machineable glass ceramic material, having elements which are mechanically pre-centred and electrically connected to connector pins at the bottom end of the gun, so that the whole column is simply plugged into a socket fixed to the CMA inner cylinder opposite to the specimen, but away from the space traversed by the exit electron beam of the CMA analyser.

The device is capable of functioning even without any bias applied to the specimen 9. In this case, backscattered electrons (BSE) are detected as the signal electrons, namely those which fit into the space angle limited by the central opening in the electrode 8. After passing this opening inwardly of the gun, they behave identically as the re-accelerated signal electrons in the SLEEM mode, as described above. The BSE imaging signal is significantly lower than the SLEEM imaging signal, due to the small acceptance angle.

The above-described method and device fulfils completely the requirements for a scanning column suitable to work inside a CMA spectrometer or similar device producing SAM mappings, such that it is purely electrostatic, of very compact design, not producing any spurious electromagnetic fields in its vicinity, and efficient in excitation and detection of signal electrons in SLEEM mode, with an electron probe operating at energies ranging from several kilo electron volts down to zero impact energy at which the probe is reflected immediately above the specimen surface. The device may operate additionally in BSE mode with a non-biased specimen. This gives the possibility of a very low energy electron microscope device.

Although the illustrated embodiment is for use with an electron microscope, alternative embodiments of the invention may have other applications. Means other than an electron gun may be utilised to stimulate emission of electrons from a specimen.

Although it is preferred that, as in the illustrated example, the specimen 9 is excited by an irradiating beam that passes along the optical axis of the apparatus, alternative means of exciting the specimen may be employed. For example, the specimen may be irradiated by one or more beam that is incident to its surface at angles of less than 90°.

A detector as illustrated has been found to detect electrons with an efficiency ranging from 80% for 1 eV emitted electrons, 97% for 10 eV emitted electrons, and 20% for 100 eV emitted electrons, to 2% for 1000 eV emitted electrons. By using low electron energy, column resolution has been found to improve over previously proposed devices by two orders of magnitude or more—e.g. from 5000 nm to 50 nm in one embodiment having Cs~150 mm and Cc~50 mm.

A detector in accordance with embodiments of the invention may be suitable for UHV applications; surface analysis applications when combined with, for example, a CMA; general SEM applications, especially when the final lens is electrostatic or compound electrostatic with magnetic; and radiation sensitive material/sample applications. Another application is to the imaging of non-conductive specimens, such as the surfaces of photoresist materials, such that high resolution can be obtained for non-charging imaging of non-conducting surfaces such as resists at suitably selected energies.

The term "earth potential" (or like terms such as "ground" potential or voltage) is used conveniently in this specification to denote a reference potential. As will be understood by those skilled in the art, although such reference potential may typically be zero potential, it is not essential that it is so, and may be a reference potential other than zero.

In this specification, terms of absolute orientation are used conveniently to denote the usual orientation of items in normal use and/or as shown in the accompanying drawings. However, such items could be disposed in other orientations, and in the context of this specification, terms of absolute orientation, such as "top", "bottom", "left", "right", "vertical" or "horizontal", etc. are to be construed accordingly, to include such alternative orientations.

In this specification, the verb "comprise" has its normal dictionary meaning, to denote non-exclusive inclusion. That is, use of the word "comprise" (or any of its derivatives) to include one feature or more, does not exclude the possibility of also including further features.

What is claimed is:

1. An electron detector having a principal axis and comprising:
    an accelerator plate for accelerating electrons emitted from a specimen, the plate having an aperture through which said electrons pass;
    a deflecting electrode arranged to deflect said electrons after passing through said aperture, by a process of secondary electron emission in response to said electrons impacting a deflecting surface of the deflecting electrode; and
    a collector disposed between said specimen and said deflecting electrode and arranged to collect electrons deflected by said deflecting electrode:
        wherein said deflecting surface of said deflecting electrode is inclined at an obtuse angle to said principal axis such that electrons emitted from the surface of the specimen travel outwardly from said principal axis and towards said deflecting surface to generate further secondary and tertiary electrons which in turn travel towards said collector, and the electron detector has rotational symmetry about said principal axis.

2. An electron detector according to claim 1, wherein said deflecting electrode is provided with an electron multiplier material on said deflecting surface to deflect said electrons emitted from said specimen, such that said multiplier multiplies such deflected electrons in use.

3. An electron detector according to claim 1, wherein said deflecting electrode is arranged to deflect said electrons radially outwardly of said principal axis.

4. An electron detector according to claim 1, wherein said deflecting electrode comprises a deflector plate formed with an aperture which is of smaller diameter than that in said accelerator plate.

5. An electron detector according to claim 1, further comprising irradiating means for irradiating a specimen in order to cause emission of said electrons from said specimen.

6. An electron detector according to claim 5, wherein said deflecting electrode comprises a deflector plate formed with an aperture which is of smaller diameter than that in said accelerator plate and said irradiating means is arranged to produce an irradiating beam that passes through said apertures in said accelerator and deflector plates.

7. An electron detector according to claim 5, including means for focussing said irradiating beam.

8. An electron detector according to claim 5, wherein said irradiating means comprises an electron gun.

9. An electron detector according to claim 8, wherein said accelerator plate and said specimen form a cathode lens.

10. An electron detector according to claim 1, further comprising means for applying an adjustable bias to the specimen.

11. An electron microscope provided with an electron detector according to claim 1.

12. An electron microscope according to claim 11, wherein said detector is mounted symmetrically on a principal axis of the microscope.

* * * * *